(12) United States Patent
Enoki et al.

(10) Patent No.: US 6,380,271 B1
(45) Date of Patent: Apr. 30, 2002

(54) MATERIAL FOR ELECTRICAL INSULATING ORGANIC FILM, ELECTRICAL INSULATING ORGANIC FILM AND PROCESS FOR THE PREPARATION THEREOF

(75) Inventors: Takashi Enoki, Yokohama; Takashi Yamaji, Fujieda; Mitsumoto Murayama, Yokohama; Yoko Hase, Susono; Toshimasa Eguchi, Yokohama, all of (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/604,675

(22) Filed: Jun. 27, 2000

(30) Foreign Application Priority Data

Apr. 7, 2000 (JP) ........................................ 2000-106988

(51) Int. Cl.$^7$ .................................................. C08J 9/00
(52) U.S. Cl. .......................... 521/77; 521/180; 521/184
(58) Field of Search ........................... 521/77, 180, 184

(56) References Cited

U.S. PATENT DOCUMENTS 3,883,452 A * 5/1975 Schuerlein et al. ............ 521/77
5,776,990 A * 7/1998 Hedrick et al. ................ 521/77

OTHER PUBLICATIONS

Takeji Hashimoto et al. "Microphase Separation and the Polymer–Polymer Interphase in Block Polymers" *Block Copolymers–Science and Technology* Ed. by D.J. Meier, MMI Press Symp. Series, (Harwood Academic Pub., N.Y. 1983) pp. 63–108.*

* cited by examiner

Primary Examiner—Morton Foelak

(74) *Attorney, Agent, or Firm*—Smith, Gambrell & Russell, LLP

(57) ABSTRACT

The present invention provides a material for electrical insulating organic film, superior in electrical properties, thermal properties and low water absorption; an electrical insulating organic film made from the material; and a process for production of the film. That is, the present invention provides an electrical insulating organic film having fine pores, consisting of a layer of a polybenzoxazole resin represented by the following general formula (1):

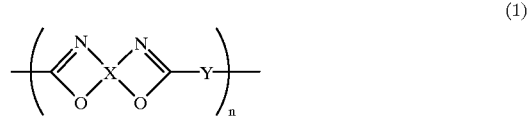

(1)

wherein n is an integer of 2 to 1,000; X is a tetravalent organic group; and Y is a bivalent organic group; a material for electrical insulating organic film obtained by mixing a polybenzoxazole precursor or a polybenzoxazole resin, with an oligomer; and a material for electrical insulating organic film, obtained by reacting at least one carboxylic acid terminal of a polybenzoxazole precursor with an amino group- or hydroxyl group-containing oligomer. The above electrical insulating organic film is produced by a process which comprises mixing a polybenzoxazole precursor or a polybenzoxazole resin with an oligomer, forming a film from the resulting mixture, and heating the film to give rise to thermal decomposition and gasification of the oligomer, to obtain a polybenzoxazole resin layer having fine pores; or by a process which comprises reacting at least one carboxylic acid terminal of a polybenzoxazole precursor with an amino group- or hydroxyl group-containing oligomer to synthesize a material for electrical insulating organic film, forming a film from the material, heating the film to give rise to ring closure of the polybenzoxazole precursor, further heating the resulting material to give rise to thermal decomposition and gasification of the oligomer group, to obtain a polybenzoxazole resin layer having fine pores.

17 Claims, No Drawings

MATERIAL FOR ELECTRICAL INSULATING ORGANIC FILM, ELECTRICAL INSULATING ORGANIC FILM AND PROCESS FOR THE PREPARATION THEREOF

FIELD OF THE INVENTION

The present invention relates to a material for electrical insulating organic film, superior in electrical properties, thermal properties, mechanical properties and physical properties; to an electrical insulating organic film made from the material; and to a process for producing such an electrical insulating organic film. This electrical insulating organic film can be used in semiconductor applications such as interlayer dielectric and protective film for semiconductor, interlayer dielectric for multilayer circuit, cover coat for flexible copper-clad laminate, solder resist film, liquid crystal-aligning film and the like.

DESCRIPTION OF RELATED ART

A variety of materials for semiconductor such as inorganic materials, organic materials and the like are in use in various applications, depending upon the properties required for them in the applications. As, for example, the interlayer dielectric for semiconductor, there is used an inorganic insulating film such as silicon dioxide formed by chemical vapor deposition. Such an inorganic film (e.g. silicon dioxide), however, has problems in high dielectric constant, high water absorption, etc. because, in recent years, semiconductor devices have come to possess higher functions and higher performances. As one means for alleviating the problems, use of an organic material is being investigated.

As the organic material for semiconductor applications, there is mentioned a polyimide resin superior in heat resistance, mechanical properties, etc.; and this resin is used in solder resist, cover lay, liquid crystal-aligning film, etc. The polymide resin, however, generally has problems in electrical properties and water absorption resistance because it has two carbonyl groups in the imide ring. To alleviate these drawbacks, it was attempted to introduce fluorine or trifluoromethyl group into the polyimide for improvement in electrical properties, water it absorption resistance and heat resistance; however, the attempt has not responded to the current requirements.

Hence, it is being attempted to use, as an insulating material for semiconductor applications, a polybenzoxazole resin superior to the polyimide resin in electrical properties and water absorption resistance. Polybenzoxazole resins easily satisfy only one of electrical properties, thermal properties or physical properties. For example, a polybenzoxazole resin composed of 4,4-diamino-3,3'-dihydroxybiphenyl and terephthalic acid has heat resistance (e.g. very high resistance to thermal decomposition and high Tg) but does not satisfy electrical properties (e.g. dielectric constant and dielectric loss tangent); and a polybenzoxazole resin composed of 2,2-bis(3-amino-4-hydroxyphenyl) hexafluoropropane and terephthalic acid shows good electrical properties (e.g. low dielectric constant) but does not satisfy heat resistance or the like. In recent years, a material of low dielectric constant has been desired which shows a dielectric constant lower than 2.5; however, no resin is developed yet which satisfies this requirement and further is superior in other electrical properties, thermal properties and physical properties.

Introduction of air (dry air has a dielectric constant of 1) into a resin to make lower the dielectric constant of the resin can be inferred from the technique for producing a foamed polymer having pores of about 20 microns in average diameter, described in U.S. Pat. No. 3,883,452 (Scheuerlein et al., issued on May 13, 1975). In order to obtain an effective insulating material by introducing air into a resin, however, it is necessary that the insulating material obtained has fine pores of submicron order and show a uniform dielectric constant.

As to the technique for obtaining fine pores of submicron order, U.S. Pat. No. 5,776,990 (Hedrick et al., issued on Jul. 7, 1998) discloses a process which comprises subjecting a block copolymer to phase separation of submicron order and heat-decomposing the heat-decomposable block component to form a resin having fine pores of submicron order. That a block copolymer can be subjected to phase separation in submicron order, is known [T. Hashimoto, M. Shibayama, M. Fujimura and H. Kawai, "Microphase Separation and the Polymer-Polymer Interphase in Block Polymers" in "Block Copolymers-Science and Technology", p. 63–108, edited by D. J. Meier (Harwood Academic Pub., N.Y., 1983)]. Further, that polymers having a low ceiling temperature decompose easily, is generally well known in the field of polymer science. However, in order to obtain a resin composition having fine pores and yet being satisfactory in dielectric constant, mechanical properties, electrical properties, water absorption resistance and heat resistance, there is a large restriction in selection of the resin, block polymerization technique and heat-decomposable component used, and no resin composition satisfactory in all of these properties is developed yet.

OBJECT AND SUMMARY OF THE INVENTION

In view of the above-mentioned problems of the prior art, the present inventors made an extensive study with an aim of providing a material for electrical insulating organic film superior in all of electrical properties, thermal properties and physical properties, an electrical insulating organic film made of the above material, and a process for producing such an electrical insulating organic film.

As a result, the present inventors found out that an electrical insulating organic film having fine pores, consisting of a layer of a polybenzoxazole resin having a structure represented by the following general formula (1), is low in dielectric constant and further superior in other electrical properties, thermal properties and physical properties, and thus the present invention has been completed based on the above finding:

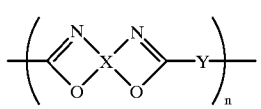

(1)

wherein n is an integer of 2 to 1,000; X is a tetravalent organic group; and Y is a bivalent organic group.

The present invention provides an electrical insulating organic film, a material for electrical insulating organic film, and a process for producing an electrical insulating organic film, each shown in one of the following (1) to (5).

(1) An electrical insulating organic film having fine pores, consisting of a layer of a polybenzoxazole resin having a structure represented by the general formula (1).

(2) A material for electrical insulating organic film, obtained by mixing a polybenzoxazole precursor or a polybenzoxazole resin with an oligomer.

(3) A material for electrical insulating organic film, obtained by reacting at least one carboxylic acid terminal of a polybenzoxazole precursor, with an amino group- or hydroxyl group-containing oligomer.

(4) A process for producing an electrical insulating organic film, which comprises mixing a polybenzoxazole recursor or a polybenzoxazole resin with an oligomer, forming a film from the resulting mixture, and heating the film to give rise to thermal decomposition and gasification of the oligomer, to obtain a polybenzoxazole resin layer having fine pores.

(5) A process for producing an electrical insulating organic film, which comprises reacting at least one carboxylic acid terminal of a polybenzoxazole precursor with an amino group- or hydroxyl group-containing oligomer to synthesize a material for electrical insulating organic film, forming a film from the material, heating the film to give rise to ring closure of the polybenzoxazole precursor, further heating the resulting material to give rise to thermal decomposition and gasification of the oligomer group, to obtain a polybenzoxazole resin layer having fine pores.

DETAILED DESCRIPTION OF THE INVENTION

The first material for electrical insulating organic film according to the present invention is obtained by uniform mixing of a polybenzoxazole precursor with an oligomer, or by uniform mixing of a polybenzoxazole resin obtained by ring closure of a polybenzoxazole precursor, with an oligomer.

The second material for electrical insulating organic film according to the present invention is obtained by reacting at least one carboxylic acid terminal of a polybenzoxazole precursor having a structure represented by the following general formula (2), with an amino group-containing oligomer:

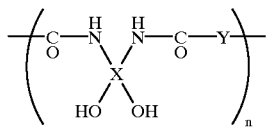

(2)

wherein n is an integer of 2 to 1,000; X is a tetravalent organic group; and Y is a bivalent organic group.

The third material for electrical insulating organic film according to the present invention is obtained by reacting at least one carboxylic acid terminal of a polybenzoxazole precursor having a structure represented by the general formula (2), with a hydroxyl group-containing oligomer.

The electrical insulating organic film of the present invention is obtained from the above material for electrical insulating organic film, consists of a resin layer made of a polybenzoxazole resin having a main structure represented by the general formula (1), and has fine pores. The electrical insulating organic film has, in the whole portion, a low dielectric constant owing to the fine pores.

In the electrical insulating organic film of the present invention having fine pores, consisting of a layer of a polybenzoxazole resin having a structure represented by the general formula (1), the desirable pore sizes are 50 nm or less, preferably 20 nm or less, and the desirable average pore diameter is 10 nm or less, preferably 5 nm or less, in view of (1) the film thickness when the film is used as an interlayer dielectric for semiconductor and (2) the distance between wirings. When the pore sizes are larger than 50 nm or the average pore diameter is larger than 10 nm, various problems arise, for example, the porosity between wirings is nonuniform, or inferior adhesivity is invited.

The proportion of the fine pores is preferably 5 to 50% by volume relative to the whole insulating material.

In the present invention, the fine pores in the electrical insulating organic film is formed by heating the oligomer contained in the first material for electrical insulating organic film or the oligomer group contained in the second or third material for electrical insulating organic film, to give rise to thermal decomposition and gasification of the oligomer or the oligomer group. In the first material for electrical insulating organic film, an oligomer is mixed with a polybenzoxazole precursor represented by the general formula (2) or a resin obtained by ring closure of the precursor in an amount of preferably 5 to 40% by weight relative to the precursor or the resin. In the second or third material for electrical insulating organic film, an oligomer is reacted with a polybenzoxazole precursor represented by the general formula (2) in an amount of preferably 5 to 40% by weight relative to the precursor. When the amount of the oligomer used is smaller than the above lower limit, the obtained reduction in dielectric constant is small; when the amount is larger than the above upper limit, the pores formed are too many, resulting in low mechanical strengths, formation of continuous foams at the surface of insulating film, nonuniform porosity and consequent variation in dielectric constant depending upon the position, and so forth.

The polybenzoxazole precursor used in the present invention is synthesized from a bisaminophenol compound and a dicarboxylic acid. The bisaminophenol is represented by the following general formula (3):

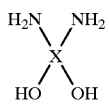

(3)

wherein X is a tetravalent organic group. It is exemplified by 2,2-bis(3-amino-4-hydroxyphenyl)propane, 2,2-bis(4-amino-3-hydroxyphenyl)propane, 2,2-bis(3-amino-4-hydroxyphenyl)hexafluoropropane, 1,4-bis(3-amino-4-hydroxyphenoxy)tetrafluorobenzene, 1,4-bis(4-amino-3-hydroxyphenoxy)tetrafluorobenzene, 4,4'-bis(3-amino-4-hydroxyphenoxy)octafluorobiphenyl, 4,4'-bis(4-amino-3-hydroxyphenoxy)octafluorobiphenyl, 2,2-bis(3-amino-4-hydroxy-5-trifluoromethylphenyl)hexafluoropropane, 2,2-bis(4-amino-3-hydroxy-5-trifluoromethylphenyl)hexafluoropropane, 2,2-bis(3-amino-4-hydroxy-5-pentafluoroethylphenyl)hexafluoropropane, 2-(3-amino-4-hydroxy-5-trifluoromethylphenyl)-2-(3-amino-4-hydroxy-5-pentafluoroethylphenyl)hexafluoropropane, 1,3-diamino-4,6-dihydroxydifluorobenzene, 1,4-diamino-3,6-dihydroxydifluorobenzene, 1,4-diamino-2,3-dihydroxydifluorobenzene, 1,2-diamino-3,6-dihydroxydifluorobenzene, 1-trifluoromethyl-2,4-diamino-3,5-dihydroxybenzene, 1-trifluoromethyl-2,5-diamino-3,6-dihydroxybenzene, 1-trifluoromethyl-2,4-diamino-3,5-dihydroxyfluorobenzene, 1-trifluoromethyl-2,5-diamino-3,6-dihydroxyfluorobenzene, 1,4-bis(trifluoromethyl)-2,5-diamino-3,6-dihydroxybenzene, 1-pentafluoroethyl-2,5-diamino-3,6-dihydroxybenzene, 1-perfluorocyclohexyl-2,5-diamino-3,6-dihydroxybenzene, 2,7-diamino-3,6-dihydroxytetrafluoronaphthalene, 2,6-diamino-3,7- dihydroxytetrafluoronaphthalene, 1,6-diamino-2,5-dihydroxytetrafluoronaphthalane, 3,6-diamino-2,5-dihydroxytetrafluoronaphthalene, 2,7-diamino-1,8-dihydroxytetrafluoronaphthalene, 1-trifluoromethyl-3,6-diamino-2,7-dihydroxynaphthalene, 1,5-bis(trifluoromethyl)-3,7-diamino-2,6-dihydroxynaphthalene, 1-trifluoromethyl-3,6-diamino-2,5-dihydroxynaphthalene, 1-pentafluoroethyl-3,6-diamino-2,7-dihydroxynaphthalene, 1-perfluorocyclohexyl-3,6-diamino-2,7-dihydroxynaphthalene, 1,5-bis(trifluoromethyl)-3,7-diamino-2,6-dihydroxydifluoronaphthalene, 1,4,5,8-tetra(trifluoromethyl)-2,7-diamino-3,6 -dihydroxynaphthalene, 3,3'-diamino-4,4'-dihydroxybiphenyl, 4,4'-diamino-3,3'-dihydroxybiphenyl, 4,4'-diamino-3,3'-dihydroxy-5,5'-trifluoromethylbiphenyl, 4,4'-diamino-3,3'-dihydroxy-5,5'-pentafluoroethylbiphenyl, 4,4'-diamino-3,3'-dihydroxy-6,6'-trifluoromethylbiphenyl, 4,4'-diamino-3,3'-dihydroxy-6,6'-pentafluoroethylbiphenyl, 3,3'-diamino-4,4'-dihydroxy-5,5'-trifluoromethylbiphenyl, 3,3'-diamino-4,4'-dihydroxy-5,5'-pentafluoroethylbiphenyl, 3,3'-diamino-4,4'-dihydroxy-6,6-'-trifluoromethylbiphenyl, 3,3'-diamino-4,4'-dihydroxy-6,6'-pentafluoroethylbiphenyl, 3,4'-diamino-4,3'-dihydroxy-5,5'-trifluoromethylbiphenyl, 3,4'-diamino-4,3'-dihydroxy-5,5'-pentafluoroethylbiphenyl, 3,4'-diamino-4,3'-dihydroxy-6,6'-trifluoromethylbiphenyl, 3,4'-diamino-4,3'-dihydroxy-6,6'-pentafluoroethylbiphenyl, 4,4'-diamino-3,3'-dihydroxybiphenyl-ether, 3,3'-diamino-4,4'-dihydroxybiphenyl-ether, 9,9-bis(4-((3-hydroxy-4-amino)-phenyloxy)-phenyl)-fluorene, 9,9-bis(4-((4-hydroxy-3-amino)-phenyloxy)-phenyl)-fluorene, 9,9-bis(4-amino-3-hydroxyphenyl)-fluorene and 9,9-bis(3-amino-4-hydroxyphenyl)-fluorene. The bisaminophenol compound is not restricted to them. It is possible to use two or more kinds of bisaminophenols in combination.

In the present invention, the dicarboxylic acid used in synthesis of the polybenzoxazole precursor is represented by the following general formula (4):

HOOC—Y—COOH    (4)

wherein Y is a bivalent organic group. It is exemplified by isophthalic acid, terephthalic acid, 3-fluoroisophthalic acid, 2-fluoroisophthalic acid, 3-fluorophthalic acid, 2-fluorophthalic acid, 2-fluoroterephthalic acid, 2,4,5,6-tetrafluoroisophthalic acid, 3,4,5,6-tetrafluorophthalic acid, 4,4'-hexafluoroisopropylidenediphenyl-1,1'-dicarboxylic acid, perfluorosuberic acid, 2,2'-bis(trifluoromethyl)-4,4'-biphenylenedicarboxylic acid, 4,4'-oxydiphenyl-1,1'-dicarboxylic acid, 2,3,4,6,7,8-hexafluoronaphthalene-1,5-dicarboxylic acid, 2,3,4,5,7,8-hexafluoronaphthalene-1,6-dicarboxylic acid, 1,3,4,5,7,8-hexafluoronaphthalene-2,6-dicarboxylic acid, 1-trifluoromethylnaphthalene-2,6-dicarboxylic acid, 1,5-bis(trifluoromethyl)naphthalene-2,6-dicarboxylic acid, 1-pentafluoroethylnaphthalene-2,6-dicarboxylic acid, 1-trifluoromethylnaphthalene-3,7-dicarboxylic acid, 1,5-bis(trifluoromethyl)naphthalene-3,7-dicarboxylic acid, 1-pentafluoroethylnaphthalene-3,7-dicarboxylic acid, 1-undecafluorocyclohexylnaphthalene-3,7-dicarboxylic acid, 1-trifluoromethyl-2,4,5,6,8-pentafluoronaphthalene-3,7-dicarboxylic acid, 1-bis(trifluoromethyl)methoxy-2,4,5,6,8-pentafluoronaphthalene-3,7-dicarboxylic acid, 1,5-bis(trifluoromethyl)-2,4,6,8-tetrafluoronaphthalene-3,7-dicarboxylic acid, 1,5-bis[bis(trifluoromethyl)methoxy]-2,4,6,8-tetrafluoronaphthalene-3,7-dicarboxylic acid, 1,4-naphthalenedicarboxylic acid, 2,6-naphthalenedicarboxylic acid, 4,4'-biphenyldicarboxylic acid and 2,2'-diphenyldicarboxylic acid. The carboxylic acid is not restricted to them. It is possible to use two or more kinds of dicarboxylic acids in combination.

There is no particular restriction as to the oligomer used in the first material for electrical insulating organic film, and it can be any oligomer as long as its thermal decomposition and gasification temperature is lower than the thermal decomposition and gasification temperatures of the polybenzoxazole resin having a structure represented by the general formula (1) and the polybenzoxazole precursor having a structure represented by the general formula (2). As the oligomer, there can be mentioned, for example, those having a skeleton comprising repeating units such as propylene oxide, ethylene oxide, tetramethylene oxide, methyl methacrylate, urethane, α-methylstyrene, styrene, carbonate, caprolactone or the like. Of these repeating units, preferred are propylene oxide, ethylene oxide, methyl methacrylate, a-methylstyrene, carbonate and caprolactone. The oligomer may be a copolymer of the above oligomers.

Specific examples of the oligomer are polycaprolactonediol, polyethylene oxide monomethyl ether, polypropylene oxide, polyethylene oxide, polytetramethylene oxide, polymethyl methacrylate, polyethyl methacrylate, polypropyl methacrylate, polybutyl methacrylate, polyurethane, poly-α-methylstyrene, polystyrene, polycaprolactone, polycarbonate, polypropylene oxide-polyethylene oxide block copolymer, polyethylene oxide-polypropylene oxide-polyethylene oxide triblock copolymer, and polypropylene oxide-polyethylene oxide-polypropylene oxide triblock copolymer.

The oligomer used in the second material for electrical insulating organic film is obtained by introducing amino group into the terminals of the above-mentioned oligomer skeleton by an ordinary method. It can be any such oligomer as long as, when it is reacted with at least one carboxylic acid terminal of a polybenzoxazole precursor represented by the general formula (2), the oligomer portion in the resulting reaction product shows a thermal decomposition and gasification temperature lower than the thermal decomposition temperature of a polybenzoxazole resin represented by the general formula (1).

The oligomer used in the third material for electrical insulating organic film has hydroxyl group at one or two terminals and is decomposable by heat. This oligomer is selected based on the thermal decomposition temperature of the oligomer portion in a reaction product formed when the hydroxyl group of the oligomer is reacted with at least one carboxylic acid terminal of a polybenzoxazole precursor represented by the general formula (2). That is, the oligomer used in the third material can be any hydroxyl group-containing oligomer as long as the oligomer portion in the above reaction product shows a thermal decomposition temperature lower than that of a resin obtained by ring closure of the polybenzoxazole precursor used in the third material.

Each oligomer used in the first to third materials for electrical insulating organic film, preferably has a molecular weight of 500 to 10,000 as the molecular weight of the repeating units portion. When the molecular weight is less than 500, a low dielectric constant may not be obtained; when the molecular weight exceeds 10,000, the formed pores may be too large, which may invite, for example, low mechanical strength of film or formation of continuous pores reaching the surface of film.

The production of the first material for electrical insulating organic film is conducted by uniformly mixing the above-mentioned polybenzoxazole precursor or a polybenzoxazole resin obtained by ring closure of the precursor, with the above-mentioned oligomer.

The production of the second or third material for electrical insulating organic film is conducted by reacting the above-mentioned polybenzoxazole precursor with the above-mentioned oligomer.

The polybenzoxazole precursor can be synthesized, for example, by reacting a bisaminophenol compound represented by the general formula (3) with a dicarboxylic acid represented by the general formula (4) by an active esterification method or an acid chloride method.

By reacting the carboxylic acid terminal(s) of the polybenzoxazole precursor obtained as above, with the amino group of an oligomer, the second material for electrical insulating organic film can be obtained; and by reacting the carboxylic acid terminal(s) of the above precursor with the hydroxyl group of an oligomer, the third material for electrical insulating organic film can be obtained.

In converting the above polybenzoxazole precursor into a polybenzoxazole resin, the precursor is heated or treated with a dehydrating agent to give rise to a condensation reaction and is subjected to ring closure in nitrogen gas at a temperature not higher than the thermal decomposition and gasification temperature of the oligomer to be mixed with the resin.

In synthesizing the polybenzoxazole precursor used in the present invention, by the acid chloride method which is one of the above-mentioned methods, first, a dicarboxylic acid represented by the general formula (4) (e.g. 4,4'-hexafluoroisopropylidenediphenyl-1,1'-dicarboxylic acid) is dissolved in an aprotic polar solvent (e.g. γ-butyrolactone) and is reacted with an excess amount of thionyl chloride at room temperature to 130° C. to obtain an acid chloride represented by the following general formula (5) (e.g. 4,4'-hexafluoroisopropylidenediphenyl-1,1'-dicarboxylic acid chloride):

$$\text{ClOC—Y—COCl} \quad (5)$$

wherein Y is a bivalent organic group. As well known, addition of an appropriate amount of N,N-dimethylformamide in the above reaction can improve the yield of the acid chloride.

Next, a bisaminophenol compound represented by the general formula (3) [e.g. 2,2-bis(3-amino-4-hydroxyphenyl) hexafluoropropane] is dissolved in a dried aprotic polar solvent (e.g. γ-butyrolactone, N,N-dimethylformamide or N-methyl-2-pyrrolidone) in a dried nitrogen atmosphere. The solvent may be a single solvent or a mixed solvent of two or more kinds. The resulting solution is cooled to 10° C. or lower. Thereto is dropwise added, in a nitrogen atmosphere, a solution of the above-synthesized acid chloride (e.g. 4,4'-hexafluoroisopropylidenediphenyl-1,1'-dicarboxylic acid chloride) dissolved in an aprotic polar solvent (e.g. γ-butyrolactone, N,N-dimethylformamide or N-methyl-2-pyrrolidone). In this case, since amide type solvents such as N,N-dimethylformamide and the like decompose the acid chloride, use of any amide type solvent is not recommendable as long as the acid chloride is soluble in a solvent other than the amide type solvent.

Further, there is dropwise added a solution of pyridine dissolved in an aprotic solvent (e.g. γ-butyrolactone, N,N-dimethylformamide or N-methyl-2-pyrrolidone). The resulting mixture solution is stirred at that temperature or at a temperature of 50° C. or lower for several hours to obtain a polybenzoxazole precursor.

The above-obtained precursor or a resin obtained by ring closure of the precursor is uniformly mixed with an oligomer, whereby the first material for electric insulating organic film is obtained.

In obtaining the second or third material for electrical insulating organic film, the above-obtained polybenzoxazole precursor is placed in a reactor; thereto is added, at one time, an amino group- or hydroxyl group-terminated oligomer, or is dropwise added a solution of the oligomer dissolved in an aprotic polar solvent (e.g. γ-butyrolactone, N,N-dimethylformamide or N-methyl-2-pyrrolidone). The resulting mixture is returned to room temperature and is stirred at that temperature for several hours to one day.

The reaction mixture is filtered to remove the pyridine hydrochloride formed. The filtrate is subjected to reprecipitation using, as a poor solvent, a mixed solvent consisting of distilled water and an alcohol (e.g. methanol or ethanol), whereby there can be obtained a reaction product between oligomer and polybenzoxazole precursor which becomes a second or third material for electrical insulating organic film of the present invention. In this case, the mixed ratio of distilled water and alcohol in the mixed solvent as a poor solvent is determined based on the solubility of the precipitate (reaction product) in alcohol. That is, when the content of alcohol in the mixed solvent is too low, the impurities including unreacted raw materials are not removed sufficiently. When the content of alcohol is too high, the reaction product between polybenzoxazole precursor and oligomer is not precipitated. The precipitate obtained by the above reprecipitation is collected by filtration and vacuum-dried, whereby a second or third material for electrical insulating organic film of the present invention can be obtained.

When impurities need be removed from the above-obtained material for electrical insulating organic film, for use of the material in semiconductor applications, the material can be further purified by repeatedly washing it with distilled water, an aqueous alcohol (e.g. methanol or ethanol) solution, a dilute aqueous oxalic acid solution, dilute hydrochloric acid or dilute ammonia water, or by dissolving the material again in an appropriate solvent and repeating reprecipitation.

In the present invention, it is preferred ordinarily that the material for electrical insulating organic film is dissolved in a solvent at a concentration of about 10 to 40% by weight (film formation is easy at this concentration) and is used in a varnish form. As the solvent, there can be used at least one kind selected from N-methyl-2-pyrrolidone, γ-butyrolactone, ε-caprolactone, N,N-dimethylacetamide, N,N-dimethylformamide, dimethyl sulfoxide, diethyl ether, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl 3-methoxypropionate, etc.

The electrical insulating organic film of the present invention is produced as follows. First, the material for electrical insulating organic film is dissolved in the above-mentioned solvent to obtain a varnish. The varnish is then coated on an appropriate substrate (e.g. glass, metal, silicon wafer or ceramic plate) for film formation. The coating is conducted by spin coating using a spinner, spray coating using a spray coater, dipping, printing, roll coating or the like. The film formed is heated if necessary or treated with a dehydrating agent, to give rise to dehydration and ring closure of the polybenzoxazole precursor and convert the precursor into a polybenzoxazole resin (thereby, the film becomes a resin layer). The resin layer is further heated preferably at a temperature range in which the polybenzoxazole resin is not thermally decomposed but the oligomer or the oligomer group is thermally decomposed; thereby, the oligomer or the oligomer group is decomposed thermally and gasified, as a result, fine pores are formed, and an electrical insulating organic film of the present invention is obtained.

To the material for electrical insulating organic film of the present invention can be added, if necessary, various additives such as surfactant, coupling agent and the like; and the resulting material can be used as an interlayer dielectric and a protective film for semiconductor, an interlayer dielectric for multilayer circuit, a cover coat for flexible copper-clad laminate, a solder resist film, a liquid crystal-aligning film, or the like.

The material for electrical insulating organic film according to the present invention can also be used as a photosensitive resin composition by combining with a naphthoquinonediazide compound which is a photosensitive material.

DESCRIPTION OF PREFERRED EMBODIMENTS

The present invention is described specifically below by way of Examples. However, the present invention is in no way restricted by the contents of the Examples.

Synthesis of Acid Chloride

Synthesis Example 1

In a reactor were placed 25 g of 4,4'-hexafluoroisopropylidenediphenyl-1,1'-dicarboxylic acid, 45 ml of thionyl chloride and 0.5 ml of dry N,N-dimethylformamide (hereinafter abbreviated as DMF). A reaction was allowed to take place at 75° C. for 2 hours. After the completion of the reaction, excessive thionyl chloride was removed by vacuum distillation under heating. The residue was recrystallized from hexane to obtain 23 g of 4,4'-hexafluoroisopropylidenediphenyl-1,1'-dicarboxylic acid dichloride.

Example 1

(1) Synthesis of Polybenzoxazole Precursor 4.27 g (11.67 mmol) of 2,2-bis(3-amino-4-hydroxyphenyl)hexafluoropropane was dissolved in 20 g of dried N-methyl-2-pyrrolidone in a dried nitrogen atmosphere. To the resulting solution was dropwise added, at 10° C. over 30 minutes, a solution of 5.00 g (11.67 mmol) of the 4,4'-hexafluoroisopropylidenediphenyl-1,1'-dicarboxylic acid dichloride obtained in Synthesis Example 1, dissolved in 20 g of γ-butyrolactone. The resulting mixture was returned to room temperature and stirred at that temperature for 2 hours. Thereto was dropwise added, at 10° C. over 30 minutes, a solution of 2.0 g of pyridine dissolved in 20 g of γ-butyrolactone. After the completion of the dropwise addition, the resulting mixture was returned to room temperature and stirred at that temperature for 24 hours. The reaction mixture was filtered to remove the pyridine hydrochloride formed. The filtrate was dropwise added to a mixed solution consisting of 0.18 liter of distilled water and 0.54 liter of ethanol. The resulting precipitate was collected and dried to obtain a polybenzoxazole precursor. The polybenzoxazole precursor was measured for a number-average molecular weight (Mn) using a GPC produced by Toso Corporation, as a polystyrene-reduced number-average molecular weight, and the molecular weight was 18,000.

(2) Preparation of Polybenzoxazole Precursor/Oligomer Mixture Varnish

An oligomer (molecular weight: 2,000) (SBU 0620 produced by Sumitomo Bayer Urethane Co., Ltd.) having a propylene oxide main chain and isocyanate groups at the two terminals was mixed with phenol of equal equivalents relative to the isocyanate group, in the presence of a basic catalyst in tetrahydrofuran, whereby was obtained a propylene oxide oligomer having carbamate groups at the two terminals. This oligomer was uniformly mixed with the polybenzoxazole precursor obtained in the above (1), in N-methyl-2-pyrrolidone so that the oligomer became 10% by weight relative to the polybenzoxazole precursor, to obtain a 20 weight % solution. The solution was filtered through a 0.2-μm teflon filter to obtain a varnish.

(3) Production of Polybenzoxazole Resin Layer Having Fine Pores

The varnish obtained in the above (2) was coated on a silicon wafer having aluminum vapor-deposited thereon, using a spin coater. At that time, the rpm of the spin coater and the coating time were set so that the film thickness after heat treatment became about 1 μm. After the coating, the coated wafer was dried for 120 seconds on a hot plate of 100° C. The resulting material was placed in an oven in which oxygen concentration was controlled at 100 ppm or less by introduction of nitrogen; and was heated at 150° C. for 30 minutes, at 250° C. for 30 minutes and at 310° C. for 30 minutes in this order, and further at 350° C. for 30 minutes and at 400° C. for 30 minutes, to obtain a polybenzoxazole film. Aluminum was vapor-deposited on the film for patterning, whereby an electrode of given size was formed. A capacity was measured between the electrode and the aluminum on the silicon wafer. After the measurement, the portion of the film in contact with and in the vicinity of the electrode was etched by using oxygen plasma; the film thickness was measured using a surface roughness tester; thereby, the dielectric constant of the film at a frequency of 1 MHz was calculated, which was 2.2. The IR spectrum of the film was measured by FT-IR; as a result, there was no absorption by amide of oxazole at 1,656 $cm^{-1}$, absorption by oxazole was seen at 1,053 $cm^{-1}$ and 1,625 $cm^{-1}$, and formation of polybenzoxazole was confirmed. The heat resistance of the film was evaluated by TG-DTA; as a result, the temperature of 5% weight decrease in nitrogen atmosphere was 513° C.

The cross section of the film was observed by TEM, which indicated formation of fine pores having an average pore diameter of 5 nm.

Example 2

(1) Synthesis of Polybenzoxazole Resin 50 ml of an Eaton's reagent (a product of Aldrich Japan Inc.) was added to 3.94 g of 2,2-bis(3-amino-4-hydroxyphenyl)hexafluoropropane and 3.92 g of 4,4'-hexafluoroisopropylidenediphenyl-1,1'-dicarboxylic acid. The resulting mixture was heated to 135° C. with stirring in a dried nitrogen atmosphere, and the stirring was continued for 24 hours in that state, to obtain a blackish brown solution. The solution was dropwise added to a solution of 45 g of sodium hydroxide dissolved in 1,500 ml of water, to precipitate a polymer. The polymer was dissolved in tetrahydrofuran, and the resulting solution was dropwise added to 1,500 ml of water to precipitate a polymer. The polymer was collected by filtration and then ground. To the ground polymer was added 200 g of methanol, followed by refluxing for 3 hours. The polymer obtained was dried at 90° C. for 3 hours to obtain an intended light purplish white polybenzoxazole resin. The polybenzoxazole resin was measured for a number-average molecular weight (Mn) using a GPC produced by Toso Corporation, as a polystyrene-reduced number-average molecular weight, and the molecular weight was 25,000.

(2) Preparation of Polybenzoxazole Resin/Oligomer Mixture Varnish

As the oligomer to be mixed with the above-obtained polybenzoxazole resin, there was used a propylene oxide oligomer having carbamates at the two terminals, obtained by mixing a commercial diisocyanate (molecular weight: 2,000) (SBU 0620 produced by Sumitomo Bayer Urethane Co., Ltd.) having a propylene oxide main chain, with phenol of equal equivalents relative to the isocyanate group, in the presence of a basic catalyst in tetrahydrofuran. This oligomer was uniformly mixed with the polybenzoxazole resin obtained in the above (1), in N-methyl-2-pyrrolidone so that the oligomer became 10% by weight relative to the polybenzoxazole resin, to obtain a 15 weight % solution. The solution was filtered through a 0.2-$\mu$m teflon filter to obtain a varnish.

(3) Production of Polybenzoxazole Resin Layer Having Fine Pores

A film of a polybenzoxazole resin was produced and evaluated in the same manner as in Example 1 except that the varnish obtained in the above (2) was used. As a result, the dielectric constant of the film at a frequency of 1 MHz was 2.2. The IR spectrum of the film was measured by FT-IR; as a result, there was no absorption by amide of oxazole at 1,656 cm$^{-1}$, absorption by oxazole was seen at 1,053 cm$^{1}$ and 1,625 cm$^{-1}$, and formation of polybenzoxazole was confirmed. The temperature of 5% weight decrease in nitrogen atmosphere, measured by TG-DTA was 513° C.

The cross section of the film was observed by TEM, which indicated formation of fine pores having an average pore diameter of 5 nm.

Example 3

A varnish was obtained in the same manner as in Example 1 except that in the Example 1 preparation of polybenzoxazole precursor/oligomer mixture varnish, the oligomer was uniformly mixed with the polybenzoxazole precursor in an amount of 20% by weight in place of 10% by weight relative to the precursor to obtain a 20 weight % solution in N-methyl-2-pyrrolidone. A film of a polybenzoxazole resin was produced and evaluated in the same manner as in Example 1 except that the Example 1 varnish was replaced by the above varnish.

As a result, the polybenzoxazole film showed a dielectric constant of 2.1 and a temperature of 5% weight decrease, of 505° C. Further, the polybenzoxazole film was confirmed to have fine pores having an average pore diameter of 6 nm.

Example 4

A varnish was obtained in the same manner as in Example 1 except that in the Example 1 preparation of polybenzoxazole precursor/oligomer mixture varnish, the oligomer used in production of the oligomer mixed with the polybenzoxazole precursor, i.e. the commercial oligomer (molecular weight: 2,000) (a product of Sumitomo Bayer Urethane Co., Ltd.) having a propylene oxide main chain and isocyanate groups at the two terminals was changed to a similar oligomer having a molecular weight of 1,000. A film of a polybenzoxazole resin was produced and evaluated in the same manner as in Example 1 except that the Example 1 varnish was replaced by the above varnish.

As a result, the polybenzoxazole film showed a dielectric constant of 2.2 and a temperature of 5% weight decrease, of 510° C. Further, the polybenzoxazole film was confirmed to have fine pores having an average pore diameter of 5 nm.

Example 5

A film of a polybenzoxazole resin was produced and evaluated in the same manner as in Example 4 except that in the Example 4 preparation of polybenzoxazole precursor/oligomer mixture varnish, the oligomer was uniformly mixed with the polybenzoxazole precursor in N-methyl-2-pyrrolidone in an amount of 30% by weight (not 10% by weight) relative to the p:recursor to obtain a 20 weight % solution.

As a result, the polybenzoxazole film showed a dielectric constant of 2.0 and a temperature of 5% weight decrease, of 502° C. Further, the polybenzoxazole film was confirmed to have fine pores having an average pore diameter of 5 nm.

Example 6

A varnish was obtained in the same manner as in Example 1 except that in the Example 1 preparation of polybenzoxazole precursor/oligomer mixture varnish, the commercial oligomer (molecular weight: 2,000) (a product of Sumitomo Bayer Urethane Co., Ltd.) having a propylene oxide main chain and isocyanate groups at the two terminals was changed to a similar oligomer having a molecular weight of 3,000 and this oligomer of 3,000 molecular weight was uniformly mixed with the polybenzoxazole precursor in N-methyl-2-pyrrolidone in an amount of 5% by weight relative to the precursor, to obtain a 20 weight % solution. A film of a polybenzoxazole resin was produced and evaluated in the same manner as in Example 1 except that the Example 1 varnish was replaced by the above varnish.

As a result, the polybenzoxazole film showed a dielectric constant of 2.1 and a temperature of 5% weight decrease, of 510° C. Further, the polybenzoxazole film was confirmed to have fine pores having an average pore diameter of 6 nm.

Example 7

A varnish was obtained in the same manner as in Example 1 except that in the Example 1 preparation of polybenzoxazole precursor/oligomer mixture varnish, the propylene oxide oligomer was changed to an ethylene oxide oligomer having a molecular weight of 2,000. A film of a polybenzoxazole resin was produced and evaluated in the same manner as in Example 1 except that the Example 1 varnish was replaced by the above varnish.

As a result, the polybenzoxazole film showed a dielectric constant of 2.2 and a temperature of 5% weight decrease, of 516° C. Further, the polybenzoxazole film was confirmed to have fine pores having an average pore diameter of 5 nm.

Example 8

A varnish was obtained in the same manner as in Example 1 except that in the Example 1 preparation of polybenzoxazole precursor/oligomer mixture varnish, the propylene oxide oligomer was changed to a methyl methacrylate oligomer having a molecular weight of 1,000 and this methyl methacrylate oligomer was uniformly mixed with the polybenzoxazole precursor in N-methyl-2-pyrrolidone in an amount of 10% by weight relative to the precursor to obtain a 20 weight % solution. A film of a polybenzoxazole resin was produced and evaluated in the same manner as in Example 1 except that the Example 1 varnish was replaced by the above varnish.

As a result, the polybenzoxazole film showed a dielectric constant of 2.1 and a temperature of 5% weight decrease, of 511° C. Further, the polybenzoxazole film was confirmed to have fine pores having an average pore diameter of 5 nm.

Example 9

A varnish was obtained in the same manner as in Example 1 except that in the Example 1 preparation of polybenzoxazole precursor/oligomer mixture varnish, the propylene oxide oligomer was changed to a urethane oligomer having a molecular weight of 5,000. A film of a polybenzoxazole resin was produced and evaluated in the same manner as in Example 1 except that the Example 1 varnish was replaced by the above varnish.

As a result, the polybenzoxazole film showed a dielectric constant of 2.1 and a temperature of 5% weight decrease, of 505° C. Further, the polybenzoxazole film was confirmed to have fine pores having an average pore diameter of 7 nm.

Example 10

A varnish was obtained in the same manner as in Example 1 except that in the Example 1 preparation of polybenzoxazole precursor/oligomer mixture varnish, the propylene oxide oligomer was changed to an α-methylstyrene oligomer having a molecular weight: of 5,000 and this α-methylstyrene oligomer was uniformly mixed with the polybenzoxazole precursor in N-methyl-2-pyrrolidone in an amount of 10% by weight relative to the precursor, to obtain a 20 weight % solution. A film of a polybenzoxazole resin was produced and evaluated in the same manner as in Example 1 except that the Example 1 varnish was replaced by the above varnish.

As a result, the polybenzoxazole film showed a dielectric constant of 2.1 and a temperature of 5% weight decrease, of 509° C. Further, the polybenzoxazole film was confirmed to have fine pores having an average pore diameter of 7 nm.

Example 11

A varnish was obtained in the same manner as in Example 1 except that in the Example 1 preparation of polybenzoxazole precursor/oligomer mixture varnish, the propylene oxide oligomer was changed to a carbonate oligomer having a molecular weight: of 3,000 and this carbonate oligomer was uniformly mixed with the polybenzoxazole precursor in N-methyl-2-pyrrolidone in an amount of 10% by weight relative to the precursor, to obtain a 20 weight % solution. A film of a polybenzoxazole resin was produced and evaluated in the same manner as in Example 1 except that the Example 1 varnish was replaced by the above varnish.

As a result, the polybenzoxazole film showed a dielectric constant of 2.1 and a temperature of 5% weight decrease, of 510° C. Further, the polybenzoxazole film was confirmed to have fine pores having an average pore diameter of 5 nm.

Example 12

A varnish was obtained in the same manner as in Example 2 except that in the Example 2 preparation of polybenzoxazole resin/oligomer mixture varnish, the oligomer used in production of the oligomer mixed with the polybenzoxazole resin, i.e. the commercial oligomer (molecular weight: 2,000) (a product of Sumitomo Bayer Urethane Co., Ltd.) having a propylene oxide main chain and isocyanate groups at the two terminals was changed to a similar oligomer having a molecular weight of 3,000. The varnish obtained above was coated on a silicon wafer having aluminum vapor-deposited thereon, using a spin coater. At that time, the rpm of the spin coater and the coating time were set so that the film thickness after heat treatment became about 1 μm. After the coating, the coated wafer was dried for 120 seconds on a hot plate of 100° C. The resulting material was placed in an oven in which oxygen concentration was controlled at 100 ppm or less by introduction of nitrogen; and was heated at 150° C. for 30 minutes, at 250° C. for 30 minutes and at 310° C. for 30 minutes in this order, and further at 350° C. for 30 minutes and at 400° C. for 30 minutes, to obtain a polybenzoxazole film. Aluminum was vapor-deposited on the film for patterning, whereby an electrode of given size was formed. A capacity was measured between the electrode and the aluminum on the silicon wafer. After the measurement, the portion of the film in contact with and in the vicinity of the electrode was etched by using oxygen plasma; the film thickness was measured using a surface roughness tester; thereby, the dielectric constant of the film at a frequency of 1 MHz was calculated, which was 2.2. The IR spectrum of the film was measured by FT-IR; as a result, there was no absorption by amide of oxazole at 1,656 $cm^{-1}$, absorption by oxazole was seen at 1,053 $cm^{-1}$ and 1,625 $cm^{-1}$, and formation of polybenzoxazole was confirmed. The heat resistance of the film was evaluated by TG-DTA; as a result, the temperature of 5% weight decrease in nitrogen atmosphere was 516° C.

The cross section of the film was observed by TEM, which indicated formation of fine pores having an average pore diameter of 5 nm.

Example 13

A varnish was obtained in the same manner as in Example 1 except that in the Example 1 synthesis of polybenzoxazole precursor, 4.27 g (11.67 mmol) of 2,2-bis(3-amino-4-hydroxyphenyl)hexafluoropropane was changed to 2.52 g (11.67 mmol) of 4,4'-diamino-3,3'-dihydroxybiphenyl and 5.00 g (11.67 mmol) of 4,4'-hexafluoroisopropylidenediphenyl-1,1'-dicarboxylic acid chloride was changed to 2.37 g (11.67 mmol) of terephthalic acid chloride. A polybenzoxazole film was produced and evaluated in the same manner as in Example 1 except that the Example 1 varnish was changed to the above varnish.

As a result, the polybenzoxazole film had a dielectric constant of 2.2 and a temperature of 5% weight decrease, of 530° C. Further, the polybenzoxazole film was confirmed to have fine pores having an average pore diameter of 5 nm.

Comparative Example 1

In a separable flask provided with a stirrer, a nitrogen-inlet tube and a dropping funnel, 14.65 g (0.04 mole) of 2,2-bis (3-amino-4-hydroxyphenyl)hexafluoropropane was dissolved in 200 g of dried dimethylacetamide, after which 7.92 g (0.20 mole) of pyridine was added. Thereto was dropwise added, at −15° C. over 30 minutes in dried nitrogen, a solution of 16.92 g (0.04 mol) of 4,4'-hexafluoroisopropylidenediphenyl-1,1'-dicarboxylic acid chloride dissolved in 100 g of dimethylacetamide. The resulting precipitate was collected and dried to obtain a powder of a polybenzoxazole precursor. The polybenzoxazole precursor was measured for a number-average molecular weight (Mn) using a GPC produced by Tosoh Corporation, as a polystyrene-reduced number-average molecular weight, which was 17,000. The precursor was dissolved in N-methyl-2-pyrrolidone to obtain a 20% solution. The solution was filtered through a 0.2-μm teflon filter to obtain a varnish.

The varnish was coated on a silicon wafer having aluminum vapor-deposited thereon, using a spin coater. At that time, the rpm of the spin coater and the coating time were set so that the film thickness after heat treatment became about 1 μμm. After the coating, the coated wafer was dried for 120 seconds on a hot plate of 100° C. The resulting material was placed in an oven in which oxygen concentration was controlled at 100 ppm or less by introduction of nitrogen; and was heated at 150° C. for 30 minutes, at 250° C. for 30 minutes and at 310° C. for 30 minutes in this order, and further, in the air, at 150° C. for 30 minutes, at 250° C. for 30 minutes, and at 400° C. for 30 minutes, to obtain a polybenzoxazole film. Aluminum was vapor-deposited on the film for patterning, whereby an electrode of given size was formed. A capacity was measured between the electrode and the aluminum on the silicon wafer. After the measurement, the portion of the film in contact with and in the vicinity of the electrode was etched by oxygen plasma; the film thickness was measured using a surface roughness tester; thereby, the dielectric constant of the film at a frequency of 1 MHz was calculated, which was 2.6. The IR spectrum of the film was measured by FT-IR; as a result, there was no absorption by amide of oxazole at 1,656 cm$^{-1}$, absorption by oxazole was seen at 1,053 cm$^{-1}$ and 1,625 cm$^{-1}$, and formation of polybenzoxazole was confirmed. The heat resistance of the film was evaluated by TG-DTA; as a result, the temperature of 5% weight decrease in nitrogen atmosphere was 516° C.

Comparative Example 2

A varnish was obtained in the same manner as in Example 1 except that in the Example 1 preparation of polybenzoxazole precursor/oligomer mixture varnish, the oligomer was mixed with the polybenzoxazole precursor in N-2-methyl-pyrrolidone in an amount of 50% by weight in place of 10% by weight relative to the precursor, to obtain a 20 weight % solution. A polybenzoxazole film was produced and evaluated in the same manner as in Example 1 except that the Example 1 varnish was changed to the above varnish.

As a result, the polybenzoxazole film showed different dielectric constants ranging from 2.0 to 2.4, depending upon the site of measurement and was nonuniform in dielectric constant. The polybenzoxazole film gave a temperature of 5% weight decrease, of 500° C. Further, the polybenzoxazole film was confirmed to have fine pores having an average pore diameter of about 100 nm.

Comparative Example 3

A varnish was obtained in the same manner as in Example 1 except that in the Example 1 preparation of polybenzoxazole precursor/oligomer mixture varnish, the oligomer mixed with the polybenzoxazole precursor, i.e. the commercial oligomer (a product of Sumitomo Bayer Urethane Co., Ltd.) having a propylene oxide main chain was changed to a carbonate oligomer having a molecular weight of 88 and this carbonate oligomer was mixed with the polybenzoxazole precursor in N-methyl-2-pyrrolidone in an amount of 10% by weight relative to the precursor, to obtain a 20 weight % solution. A polybenzoxazole film was produced and evaluated in the same manner as in Example 1 except that the Example 1 varnish was changed to the above varnish.

As a result, the polybenzoxazole film had a dielectric constant of 2.6 and a temperature of 5% weight decrease, of 516° C. Further, the polybenzoxazole film was confirmed to have fine pores having an average pore diameter of 5 nm.

Comparative Example 4

A varnish was obtained in the same manner as in Example 1 except that in the Example 1 preparation of polybenzoxazole precursor/oligomer mixture varnish, the commercial oligomer (molecular weight: 2,000) (a product of Sumitomo Bayer Urethane Co., Ltd.) having a propylene oxide main chain and isocyanate groups at the two terminals was changed to an a-methyl methacrylate oligomer having a molecular weight of 30,000 and this oligomer of 30,000 molecular weight was mixed with the polybenzoxazole precursor in N-methyl-2-pyrrolidone in an amount of 10% by weight relative to the precursor, to obtain a 20 weight % solution. A film of a polybenzoxazole resin was produced and evaluated in the same manner is in Example 1 except that the Example 1 varnish was replaced by the above varnish.

As a result, the measurement of dielectric constant for the polybenzoxazole film was impossible because the upper and lower electrodes caused short-circuiting. The polybenzoxazole film gave a temperature of 5% weight decrease, of 503° C. Further, the polybenzoxazole film had fine pores having an average pore diameter of 1 $\mu$m.

Introduction of Amino Group into Propylene Oxide Oligomer Terminals

Synthesis Example 2

30 g (9.68 mmol) of a propylene oxide oligomer (molecular weight: 3,000) (Polyhardner D-300, a product of Daiichi Kogyo Seiyaku Co., Ltd.) was dissolved in 80 g of dried tetrahydrofuran in a dried nitrogen atmosphere. Thereto was dropwise added 1.15 g (14.52 mmol) of pyridine. Thereto was dropwise added, at 5° C. over 30 minutes, a solution of 2.63 g (14.52 mmol) of 4-nitrobenzoic acid chloride dissolved in 20 g of tetrahydrofuran. After the completion of the dropwise addition, the resulting mixture was returned to room temperature and stirred at that temperature for 24 hours. The reaction mixture was filtered to remove the pyridine hydrochloride formed, and the filtrate was concentrated for solvent removal, to obtain a 4-nitrobenzoic acid ester of the propylene oxide oligomer. This ester was dissolved in 100 g of tetrahydrofuran. The solution was mixed with 0.5 g of 5% palladium carbon in a hydrogen gas atmosphere, and the mixture was stirred at room temperature for 24 hours. The reaction mixture was filtered through Cerite, and the filtrate was concentrated for solvent removal, to obtain a propylene oxide oligomer whose terminals were esterified with 4-aminobenzoic acid. The propylene oxide oligomer was measured for thermal decomposition temperature in a nitrogen atmosphere by thermogravimetric analysis, and the thermal decomposition temperature was 360° C.

Synthesis Example 3

A propylene oxide oligomer whose terminals were esterified with 4-aminobenzoic acid, was obtained in the same manner as in Synthesis Example 2 except that 30 g (9.68 mmol) of the propylene oxide oligomer (molecular weight: 3,000) used in Synthesis Example 2 was changed to 11 g (9.68 mmol) of a propylene oxide oligomer (molecular weight: 1,000) (a product of Daiichi Kogyo Seiyaku Co., Ltd.) . The propylene oxide oligomer was measured for thermal decomposition temperature in a nitrogen atmosphere by thermogravimetric analysis, and the thermal decomposition temperature was 355° C.

Synthesis Example 4

A propylene oxide oligomer whose terminals were esterified with 4-aminobenzoic acid, was obtained in the same manner as in Synthesis Example 2 except that 30 g (9.68 mmol) of the propylene oxide oligomer (molecular weight: 3,000) used in Synthesis Example 2 was changed to 39 g (9.68 mmol) of a propylene oxide oligomer (molecular weight: 4,000) (a product of Daiichi Kogyo Seiyaku Co., Ltd.). The propylene oxide oligomer was measured for thermal decomposition temperature in a nitrogen atmosphere by thermogravimetric analysis, and the thermal decomposition temperature was 362° C.

Example 14

(1) Synthesis of Polybenzoxazole Precursor 4.14 g (11.31 mmol) of 2,2-bis(3-amino-4-hydroxyphenyl)hexafluoropropane was dissolved in 20 g of dried N-methyl-2-pyrrolidone in a dried nitrogen atmosphere. To the resulting solution was dropwise added, at 10° C. over 30 minutes, a solution of 5.00 g (11.65 mmol) of the 4,4'-hexafluoroisopropylidenediphenyl-1,1'-dicarboxylic acid dichloride obtained in Synthesis Example 1, dissolved in 20 g of γ-butyrolactone. The resulting mixture was returned to room temperature and stirred at that temperature for 2 hours. Thereto was dropwise added, at 10° C. over 30 minutes, a solution of 2.69 g of pyridine dissolved in 20 g of γ-butyrolactone. After the completion of the dropwise addition, the resulting mixture was returned to room temperature and stirred at that temperature for 4 hours, to obtain a polybenzoxazole precursor solution. The polybenzoxazole precursor had a number-average molecular weight of 13,000.

(2) Reaction Between Polybenzoxazole Precursor and Oligomer, and Preparation of Varnish 2.00 g (0.67 mmol) of the propylene oxide oligomer whose terminals were esterified with 4-aminobenzoic acid, obtained in Synthesis Example 2 was dissolved in 10 g of γ-butyrolactone. The resulting solution was dropwise added to the above-obtained polybenzoxazole precursor solution. The resulting mixture was stirred at room temperature for 24 hours to give rise to a reaction. After the completion of the reaction, the reaction mixture was filtered to remove the pyridine hydrochloride formed. The filtrate was dropwise added to a mixed solution consisting of 0.18 liter of distilled water and 0.54 liter of ethanol. The resulting precipitate was collected and dried to obtain a reaction product between the oligomer and the polybenzoxazole precursor. The reaction product was dissolved in N-methyl-2-pyrrolidone to obtain a 20% solution. The solution was filtered through a 0.2-μm teflon filter to obtain a varnish.

(3) Production of Polybenzoxazole Resin Layer Having Fine Pores

The above-prepared varnish was coated on a silicon wafer having aluminum vapor-deposited thereon, using a spin coater. At that time, the rpm of the spin coater and the coating time were set so that the film thickness after heat treatment became about 1 μm. After the coating, the coated wafer was dried for 120 seconds on a hot plate of 100° C. The resulting material was placed in an oven wherein oxygen concentration had been controlled at 100 ppm or less by introduction of nitrogen; and was heated at 150° C. for 30 minutes and at 250° C. for 60 minutes in this order to give rise to dehydration and ring closure, whereby was obtained a film of an oligomer-terminated polybenzoxazole resin. The film was further heated at 350° C. for 60 minutes and at 400° C. for 30 minutes for decomposition of the oligomer group, to obtain a film of a polybenzoxazole resin having fine pores. Aluminum was vapor-deposited on the film for patterning, whereby an electrode of given size was formed. A capacity was measured between the electrode and the aluminum on the silicon wafer. After the measurement, the portion of the film in contact with and in the vicinity of the electrode was etched by using oxygen plasma; the film thickness was measured using a surface roughness tester; thereby, the dielectric constant of the film at a frequency of 1 MHz was calculated, which was 2.2. The IR spectrum of the film was measured by FT-IR; as a result, there was no absorption by amide of oxazole at 1,656 $cm^{-1}$, absorption by oxazole was seen at 1,053 $cm^{-1}$ and 1,625 $cm^{-1}$, and formation of polybenzoxazole was confirmed. The heat resistance of the film was evaluated by TG-DTA; as a result, the temperature of 5% weight decrease in nitrogen atmosphere was 513° C.

The cross section of the film was observed by TEM, which indicated that the pores formed had an average pore diameter of 5 nm and were discontinuous.

Example 15

Synthesis of polybenzoxazole precursor, reaction between polybenzoxazole precursor and oligomer, and preparation of varnish were conducted in the same manner as in Example 14 except that in the Example 14 synthesis of polybenzoxazole precursor, the amount of 2,2-bis(3-amino-4-hydroxyphenyl)hexafluoropropane used was changed from 4.14 g (11.31 mmol) to 4.02 g (10.98 mmol) and, in the Example 14 reaction between polybenzoxazole precursor and oligomer, the amount of the propylene oxide oligomer esterified with 4-aminobenzoic acid, having a molecular weight of 3,000 was changed from 2.00 g (0.67 mmol) to 4.00 g (1.33 mmol). The polybenzoxazole precursor before reaction with the oligomer had a number-average molecular weight of 12,000. Using the varnish, a film of a polybenzoxazole resin was produced and evaluated in the same manner as in Example 14.

As a result, the polybenzoxazole film had a dielectric constant of 2.1 and a temperature of 5% weight decrease, of 505° C. The cross section of the polybenzoxazole film was observed by TEM, which indicated that the pores formed had an average pore diameter of 6 nm and were discontinuous.

Example 16

Synthesis of polybenzoxazole precursor, reaction between polybenzoxazole precursor and oligomer, and preparation of varnish were conducted in the same manner as in Example 14 except that in the Example 14 synthesis of polybenzoxazole precursor, the amount of 2,2-bis(3-amino-4-hydroxyphenyl)hexafluoropropane used was changed from 4.14 g (11.31 mmol) to 3.96 g (10.82 mmol) and, in the Example 14 reaction between polybenzoxazole precursor and oligomer, the amount of the propylene oxide oligomer esterified with 4-aminobenzoic acid, having a molecular weight of 3,000 was changed from 2.00 g (0.67 mmol) to 5.00 g (1.67 mmol). The polybenzoxazole precursor before reaction with the oligomer had a number-average molecular weight of 10,000. Using the varnish, a film of a polybenzoxazole resin was produced and evaluated in the same manner as in Example 14.

As a result, the polybenzoxazole film had a dielectric constant of 2.0 and a temperature of 5% weight decrease, of 502° C. The cross section of the polybenzoxazole film was observed by TEM, which indicated that the pores formed had an average pore diameter of 4 nm and were discontinuous.

Example 17

Synthesis of polybenzoxazole precursor, reaction between polybenzoxazole precursor and oligomer, and preparation of varnish were conducted in the same manner as in Example 14 except that in the Ex-ample 14 synthesis of polybenzoxazole precursor, 4.14 g (11.31 mmol) of 2,2-bis(3-amino-4-hydroxyphenyl)hexafluoropropane was changed to 2.45 g (11.31 mmol) of 4,4'-diamino-3,3'-dihydroxybiphenyl and 5.00 g (11.65 mmol) of 4,4'-hexafluoroisopropylidenediphenyl-1,1'-dicarboxylic acid chloride was changed to 2.37 g (:1.65 mmol) of terephthalic acid chloride obtained according to the operation of Synthesis Example 1 by using, in Synthesis Example 1, terephthalic acid as a carboxylic acid. The polybenzoxazole precursor before reaction with the oligomer had a number-average molecular weight of 13,000. Using the varnish, a film of a polybenzoxazole resin was produced and evaluated in the same manner as in Example 14.

As a result, the polybenzoxazole film had a dielectric constant of 2.2 and a temperature of 5% weight decrease, of 530° C. The cross section of the polybenzoxazole film was observed by TEM, which indicated that the pores formed had an average pore diameter of 6 nm and were discontinuous.

Example 18

Synthesis of polybenzoxazole precursor, reaction between polybenzoxazole precursor and oligomer, and preparation of varnish were conducted in the same manner as in Example 14 except that in the Example 14 synthesis of polybenzoxazole precursor, the amount of 2,2-bis(3-amino-4-hydroxyphenyl)hexafluoropropane used was changed from 4.14 g (11.31 mmol) to 3.90 g (10.67 mmol) and, in the Example 14 reaction between polybenzoxazole precursor and oligomer, 2.00 g (0.67 mmol) of the propylene oxide oligomer esterified with 4-aminobenzoic acid, having a molecular weight of 3,000 was changed to 2.00 g (2.00 mmol) of the propylene oxide oligomer esterified with 4-aminobenzoic acid, having a molecular weight of 1,000, obtained in Synthesis Example 3. The polybenzoxazole precursor before reaction with the oligomer had a number-average molecular weight of 10,000. Using the varnish, a film of a polybenzoxazole resin was produced and evaluated in the same manner as in Example 4.

As a result, the polybenzoxazole film had a dielectric constant of 2.2 and a temperature of 5% weight decrease, of 510° C. The cross section of the polybenzoxazole film was observed by TEM, which indicated that the pores formed had an average pore diameter of 3 nm and were discontinuous.

Example 19

Synthesis of polybenzoxazole precursor, reaction between polybenzoxazole precursor and oligomer, and preparation of varnish were conducted in the same manner as in Example 14 except that in the Example 14 synthesis of polybenzoxazole precursor, the amount of 2,2-bis(3-amino-4-hydroxyphenyl)hexafluoropropane used was changed from 4.14 g (11.31 mmol) to 4.22 g (11.52 mmol) and, in the Example 14 reaction between polybenzoxazole precursor and oligomer, 2.00 g (0.67 mmol) of the propylene oxide oligomer esterified with 4-aminobenzoic acid, having a molecular weight of 3,000 was changed to 1.00 g (0.25 mmol) of the propylene oxide oligomer esterified with 4-aminobenzoic acid, having a molecular weight of 4,000 obtained in Synthesis Example 4. The polybenzoxazole precursor before reaction with the oligomer had a number-average molecular weight of 20,000. Using the varnish, a film of a polybenzoxazole resin was produced and evaluated in the same manner as in Example 14.

As a result, the polybenzoxazole film had a dielectric constant of 2.1 and a temperature of 5% weight decrease, of 510° C. The cross section of the polybenzoxazole film was observed by TEM, which indicated that the pores formed had an average pore diameter of 7 nm and were discontinuous.

Introduction of Amino Group into Ethylene Oxide Oligomer Terminals

Synthesis Example 5

An ethylene oxide oligomer whose terminals were esterified with 4-aminobenzoic acid, was obtained in the same manner as in Synthesis Example 2 except that 30 g (9.68 mmol) of the propylene oxide oligomer having a molecular weight of 3,000, used in Synthesis Example 2 was changed to 30 g (9.68 mmol) of an ethylene oxide oligomer having a molecular weight of 3,000. The ethylene oxide oligomer obtained was measured for thermal decomposition temperature in a nitrogen atmosphere by thermogravimetric analysis, and the thermal decomposition temperature was 376° C.

Example 20

Synthesis of polybenzoxazole precursor, reaction between polybenzoxazole precursor and oligomer, and preparation of varnish were conducted in the same manner as in Example 14 except that in the Example 14 reaction between polybenzoxazole precursor and oligomer, the propylene oxide oligomer esterified with 4-aminobenzoic acid, having a molecular weight of 3,000 was changed to the same weight of the ethylene oxide oligomer esterified with 4-aminobenzoic acid, having a molecular weight of 3,000, obtained in Synthesis Example 5. Using the varnish obtained, a polybenzoxazole resin film was produced and evaluated in the same manner as in Example 14.

As a result, the polybenzoxazole film had a dielectric constant of 2.2 and a temperature of 5% weight decrease, of 516° C. The cross section of the polybenzoxazole film was observed by TEM, which indicated that the pores formed had an average pore diameter of 6 nm and were discontinuous.

Introduction of Amino Group into Carbonate Oligomer Terminals

Synthesis Example 6

A carbonate oligomer whose terminals were esterified with 4-aminobenzoic acid, was obtained in the same manner as in Synthesis Example 2 except that 30 g (9.68 mmol) of the propylene oxide oligomer having a molecular weight of 3,000, used in Synthesis Example 2 was changed to 30 g (9.68 mmol) of a carbonate oligomer having a molecular weight of 3,000. The carbonate oligomer obtained was measured for thermal decomposition temperature in a nitrogen atmosphere by thermogravimetric analysis, and the thermal decomposition temperature was 354° C.

Example 21

Synthesis of polybenzoxazole precursor, reaction between polybenzoxazole precursor and oligomer, and preparation of varnish were conducted in the same manner as in Example 14 except that in the Example 14 reaction between polybenzoxazole precursor and oligomer, the propylene oxide oligomer esterified with 4-aminobenzoic acid, having a molecular weight of 3,000 was changed to the same weight of the carbonate oligomer esterified with 4-aminobenzoic acid, having a molecular weight of 3,000, obtained in Synthesis Example 6. Using the varnish obtained, a polybenzoxazole resin film was produced and evaluated in the same manner as in Example 14.

As a result, the polybenzoxazole film had a dielectric constant of 2.1 and a temperature of 5% weight decrease, of 510° C. The cross section of the polybenzoxazole film was observed by TEM, which indicated that the pores formed had an average pore diameter of 5 nm and were discontinuous.

Synthesis of Styrene Oligomer and Introduction of Amino Group into Styrene Oligomer Terminals Synthesis Example 7

10 g (96 mmol) of styrene was dissolved in 100 g of dried tetrahydrofuran in a dried nitrogen atmosphere. The resulting solution was cooled to −78° C. Thereto was added sec-butyllithium as a reaction agent, followed by stirring for 3 hours. Successively, 0.044 g (1.0 mmol) of ethylene epoxide was added, followed by stirring for 3 hours, and then 3 g of methanol was added. The resulting solution was concentrated for solvent removal. The concentrate was dissolved in 100 g of tetrahydrofuran, followed by filtration. The filtrate was vacuum-concentrated and dried to obtain a hydroxyl-terminated styrene oligomer having a molecular weight of 9,600. The styrene oligomer was measured for thermal decomposition temperature in a nitrogen atmosphere by thermogravimetric analysis, and the thermal decomposition temperature was 365° C.

A styrene oligomer esterified with 4-aminobenzoic acid at the terminals, having a molecular weight of 9,600 was obtained in the same manner as in Synthesis Example 2 except that 30 g (9.68 mmol) of the propylene oxide oligomer having a molecular weight of 3,000, used in Synthesis Example 2 was changed to 93 g (9.68 mmol) of the styrene oligomer having a molecular weight of 9,600, obtained in the above synthesis.

Example 22

Synthesis of polybenzoxazole precursor, reaction between polybenzoxazole precursor and oligomer, and preparation of varnish were conducted in the same manner as in Example 14 except that in the Example 14 synthesis of polybenzoxazole precursor, the amount of 2,2-bis(3-amino-4-hydroxyphenyl)hexafluoropropane used was changed from 4.14 g (11.31 mmol) to 4.23 g (11.55 mmol) and, in the Example 14 reaction between polybenzoxazole precursor and oligomer, 2.00 g (0.67 mmol) of the propylene oxide oligomer esterified with 4-aminobenzoic acid, having a molecular weight of 3,000 was changed to 2.00 g (0.21 mmol) of the styrene oligomer esterified with 4-aminobenzoic acid, having a molecular weight of 9,600, obtained in Synthesis Example 7. Using the varnish obtained, a polybenzoxazole resin film was produced and evaluated in the same manner as in Example 14.

As a result, the polybenzoxazole film had a dielectric constant of 2.1 and a temperature of 5% weight decrease, of 509° C. The cross section of the polybenzoxazole film was observed by TEM, which indicated that the pores formed had an average pore diameter of 7 nm and were discontinuous.

Synthesis of Methyl Methacrylate Oligomer and Introduction of Amino Group into the Oligomer Terminal Synthesis Example 8

A methyl methacrylate oligomer was synthesized and, using this oligomer, a methyl methacrylate oligomer esterified with 4-aminobenzoic acid at the terminals, having a molecular weight of 9,600 was obtained, in the same manner as in Synthesis Example 7 except that 10 g (96 mmol) of the styrene used in the oligomer synthesis of Synthesis Example 7 was changed to 10 g (96 mmol) of methyl methacrylate. The methyl methacrylate oligomer obtained was measured for thermal decomposition temperature in a nitrogen atmosphere by thermogravimetric analysis, and the thermal decomposition temperature was 362° C.

Example 23

Synthesis of polybenzoxazole precursor, reaction between polybenzoxazole precursor and oligomer, and preparation of varnish were conducted in the same manner as in Example 14 except that in the Example 14 synthesis of polybenzoxazole precursor, the amount of 2,2-bis(3-amino-4-hydroxyphenyl)hexafluoropropane used was changed from 4.14 g (11.31 mmol) to 4.23 g (11.55 mmol) and, in the Example 14 reaction between polybenzoxazole precursor and oligomer, 2.00 g (0.67 mmol) of the propylene oxide oligomer esterified with 4-aminobenzoic acid, having a molecular weight of 3,000 was changed to 2.00 g (0.217 mmol) of the methyl methacrylate oligomer esterified with 4-aminobenzoic acid, having a molecular weight of 9,600, obtained in Synthesis Example 8. Using the varnish obtained, a polybenzoxazole resin film was produced and evaluated in the same manner as in Example 14.

As a result, the polybenzoxazole film had a dielectric constant of 2.1 and a temperature of 5% weight decrease, of 511° C. The cross section of the polybenzoxazole film was observed by TEM, which indicated that the pores formed had an average pore diameter of 7 nm and were discontinuous.

Synthesis Example 9

A polyethylene oxide-polypropylene oxide-polyethylene oxide triblock copolymer oligomer esterified with 4-aminobenzoic acid at the terminals was obtained in the same manner as in Synthesis Example 2 except that 30 g (9.68 mmol) of the propylene oxide oligomer having a molecular weight of 3,000, used in the Synthesis Example 2 was changed to 32 g (9.68 mmol) of a polyethylene oxide-polypropylene oxide-polyethylene oxide triblock copolymer oligomer having a molecular weight of 3,300 (a product of Daiichi Kogyo Seiyaku Co., Ltd.). The polyethylene oxide-polypropylene oxide-polyethylene oxide oligomer obtained was measured for thermal decomposition temperature in a nitrogen atmosphere by thermogravimetric analysis, and the thermal decomposition temperature was 364° C.

Example 24

Synthesis of polybenzoxazole precursor, reaction between polybenzoxazole precursor and oligomer, and preparation of varnish were conducted in the same manner as in Example 14 except that in the Example 14 synthesis of polybenzoxazole precursor, the amount of 2,2-bis(3-amino-4-hydroxyphenyl)hexafluoropropane used was changed from 4.14 g (11.31 mmol) to 4.16 g (11.36 mmol) and, in the Example 14 reaction between polybenzoxazole precursor and oligomer, 2.00 g (0.67 mmol) of the propylene oxide oligomer esterified with 4-aminobenzoic acid, having a molecular weight of 3,000 was changed to 2.00 g (0.58 mmol) of the polyethylene oxide-polypropylene oxide-polyethylene oxide triblock copolymer oligomer esterified with 4-aminobenzoic acid, obtained in Synthesis Example 9. Using the varnish obtained, a polybenzoxazole resin film was produced and evaluated in the same manner as in Example 14.

As a result, the polybenzoxazole film had a dielectric constant of 2.2 and a temperature of 5% weight decrease, of 512° C. The cross section of the polybenzoxazole film was observed by TEM, which indicated that the pores formed had an average pore diameter of 5 nm and were discontinuous.

Synthesis Example 10

A polyethylene oxide-polypropylene oxide diblock copolymer oligomer esterified with 4-aminobenzoic acid at the terminals was obtained in the same manner as in Synthesis Example 2 except that 30 g (9.68 mmol) of the propylene oxide oligomer having a molecular weight of 3,000, used in Synthesis Example 2 was changed to 19.4 g (9.68 mmol) of a polyethylene oxide-polypropylene oxide diblock copolymer oligomer having a molecular weight of 2,000 (a product of NOF CORP.). The polyethylene oxide-polypropylene oxide oligomer obtained was measured for thermal decomposition temperature in a nitrogen atmosphere by thermogravimetric analysis, and the thermal decomposition temperature was 362° C.

Example 25

Synthesis of polybenzoxazole precursor, reaction between polybenzoxazole precursor and oligomer, and preparation of varnish were conducted in the same manner as in Example 14 except that in the Example 14 synthesis of polybenzoxazole precursor, the amount of 2,2-bis(3-amino-4-hydroxyphenyl)hexafluoropropane used was changed from 4.14 g (11.31 mmol) to 4.16 g (11.15 mmol) and, in the Example 14 reaction between polybenzoxazole precursor and oligomer, 2.00 g (0.67 mmol) of the propylene oxide oligomer esterified with 4-aminobenzoic acid, having a molecular weight of 3,000 was changed to 2.00 g (0.58 mmol) of the polyethylene oxide-polypropylene oxide diblock copolymer oligomer esterified with 4-aminobenzoic acid, obtained in Synthesis Example 10. Using the varnish obtained, a polybenzoxazole resin film was produced and evaluated in the same manner as in Example 14.

As a result, the polybenzoxazole film had a dielectric constant of 2.2 and a temperature of 5% weight decrease, of 513° C. The cross sect-ion of the polybenzoxazole film was observed by TEM, which indicated that the pores formed had an average pore diameter of 4 nm and were discontinuous.

Comparative Example 5

Synthesis of polybenzoxazole precursor, reaction between polybenzoxazole precursor and oligomer, and preparation of varnish were conducted in the same manner as in Example 14 except that in the Example 14 synthesis of polybenzoxazole precursor, the amount of 2,2-bis(3-amino-4-hydroxyphenyl)hexafluoropropane used was changed from 4.14 g (11.31 mmol) to 3.78 g (10.32 mmol) and, in the Example 14 reaction between polybenzoxazole precursor and oligomer, the amount of the propylene oxide oligomer esterified with 4-aminobenzoic acid, having a molecular weight of 3,000 was changed from 2.00 g (0.67 mmol) to 8.00 g (2.67 mmol). Using the varnish obtained, a polybenzoxazole resin film was produced and evaluated in the same manner as in Example 14.

As a result, the polybenzoxazole film had a dielectric constant of 2.0 and a temperature of 5% weight decrease, of 420° C. Further, the polybenzoxazole resin film was confirmed to have fine pores of 100 nm or less.

Introduction of Amino Group into Carbonate Terminals

Synthesis Example 11

A carbonate esterified with 4-aminobenzoic acid at the terminals was obtained in the same manner as in Synthetic Example 2 except that 30 g (9.68 mmol) of the propylene oxide oligomer having a molecular weight of 3,000, used in Synthetic Example 2 was changed to 0.85 g (9.68 mmol) of ethylene carbonate having a molecular weight of 88. The carbonate obtained was measured for thermal decomposition temperature in a nitrogen atmosphere by thermogravimetric analysis, arid the thermal decomposition temperature was 260° C.

Comparative Example 6

Synthesis of polybenzoxazole precursor, reaction between polybenzoxazole precursor and oligomer, and preparation of varnish were conducted in the same manner as in Example 14 except that in the Example 14 synthesis of polybenzoxazole precursor, the amount of 2,2-bis(3-amino-4-hydroxyphenyl)hexafluoropropane used was changed from 4.14 g (11.31 mmol) to 1.65 g (4.51 mmol) and, in the Example 14 reaction between polybenzoxazole precursor and oligomer, 2.00 g (0.67 mmol) of the propylene oxide oligomer esterified with 4-aminobenzoic acid, having a molecular weight of 3,000 was changed to 2.97 g (14.29 mmol) of the ethylene carbonate esterified with 4-aminobenzoic acid, having a molecular weight of 88, obtained in Synthesis Example 11. Using the varnish obtained, a polybenzoxazole resin film was produced and evaluated in the same manner as in Example 14.

As a result, the polybenzoxazole film had a dielectric constant of 2.6 and a temperature of 5% weight decrease, of 516° C. The cross section of the polybenzoxazole film was observed by TEM, which indicated no pore.

Synthesis of Methyl Methacrylate Oligomer and Introduction of Amino Group into Methyl Methacrylate Oligomer Terminals Synthesis Example 12

A methyl methacrylate oligomer having a molecular weight of 30,000 was obtained in the same manner as in Synthesis Example 7 except that 10 g (96 mmol) of the styrene used in the oligomer synthesis of Synthesis Example 7 was changed to 30 g (288 mmol) of methyl methacrylate. The methyl methacrylate oligomer obtained was measured for thermal decomposition temperature in a nitrogen atmosphere by thermogravimetric analysis, and the thermal decomposition temperature was 360° C.

Next, a methyl methacrylate oligomer esterified with 4-aminobenzoic acid at the terminals, having a molecular weight of 30,000 was obtained in the same manner as in Synthesis Example 2 except that 30 g (9.68 mmol) of the propylene oxide oligomer having a molecular weight of 3,000, used in Synthesis Example 2 was changed to 290 g (9.68 mmol) of the methyl methacrylate oligomer having a molecular weight of 30,000, obtained in the above synthesis, the amount of pyridine used was changed from 1.15 g (14.52 mmol) to 3.56 g (0.45 mmol), and the amount of 4-nitrobenzoic acid chloride used was changed from 2.63 g (14.52 mmol) to 0.08 g (0.45 mmol).

Comparative Example 7

Synthesis of polybenzoxazole precursor, reaction between polybenzoxazole precursor and oligomer, and preparation of varnish were conducted in the same manner as in Example 14 except that in the Example 14 synthesis of polybenzoxazole precursor, the amount of 2,2-bis(3-amino-4-hydroxyphenyl)hexafluoropropane used was changed from 4.14 g (11.31 mmol) to 4.24 g (11.59 mmol) and, in the Example 14 reaction between polybenzoxazole precursor and oligomer, 2.00 g (0.67 mmol) of the propylene oxide oligomer esterified with 4-aminobenzoic acid, having a molecular weight of 3,000 was changed to 2.00 g (0.07 mmol) of the methyl methacrylate oligomer esterified with 4-aminobenzoic acid, having a molecular weight of 30,000, obtained in Synthesis Example 12. Using the varnish obtained, a polybenzoxazole resin film was produced and evaluated in the same manner as in Example 14.

As a result, the measurement of dielectric constant for the polybenzoxazole film was impossible because the upper and lower electrodes caused short-circuiting. The polybenzoxazole film gave a temperature of 5% weight decrease, of 455° C. Further, the cross section of the polybenzoxazole film was observed by TEM, which indicated formation of pores having an average pore diameter of 1 µm.

Example 26

(1) Synthesis of Polybenzoxazole Precursor 8.52 g (23.3 mmol) of 2,2-bis(3-amino-4-hydroxyphenyl) hexafluoropropane was dissolved in 40 g of dried N-methyl-2-pyrrolidone in a dried nitrogen atmosphere. To the resulting solution was dropwise added, at 10° C. over 30 minutes, a solution of 10.73 g (25.0 mmol) of the 4,4'-hexafluoroisopropylidenediphenyl-1,1'-dicarboxylic acid dichloride obtained in Synthesis Example 1, dissolved in 80 g of γ-butyrolactone. The resulting mixture was returned to room temperature and stirred at that temperature for 2 hours. Thereto was dropwise added, at 10° C. over 30 minutes, a solution of 4.35 g of pyridine dissolved in 20 g of γ-butyrolactone. After the completion of the dropwise addition, the resulting mixture was returned to room temperature and stirred at that temperature for 4 hours to obtain a polybenzoxazole precursor solution. The polybenzoxazole precursor obtained had a number-average molecular weight of 11,000.

(2) Reaction Between Polybenzoxazole Precursor and Oligomer and Preparation of Varnish Then, 13.6 g (3.4 mmol) of a polycaprolactonediol (Placcel 240, a product of Daicel Chemical Industries, Ltd., molecular weight=4,000) was added, in one portion, to the polybenzoxazole precursor solution obtained in the above (1), followed by stirring at room temperature for 24 hours to give rise to a reaction.

After the completion of the reaction, the reaction mixture was dropwise added to a mixed solution consisting of 1.5 liters of distilled water and 0.3 liter of ethanol. The resulting precipitate was collected by filtration. In order to wash the precipitate, a mixed solution consisting of 1.5 liters of distilled water and 0.15 liter of ethanol was added to the precipitate, the mixture was stirred at room temperature for 1 hour, filtration was conducted to collect a precipitate; this operation was repeated three times. The precipitate collected was vacuum-dried and then washed with 1 liter of cyclohexane 5 times. The washed precipitate was vacuum-dried to obtain 20 g of a material for electrical insulating organic film. The weight fraction of the reacted oligomer in the material for electrical insulating organic film was 39% by $^1$H-NMR analysis.

The above-obtained material for electrical insulating organic film was dissolved in N-methyl-2-pyrrolidone to obtain a 20% solution. The solution was filtered through a 0.1-µm teflon filter to obtain a varnish.

Measurement of Thermal Decomposition Temperature of Hydroxyl Group-containing Oligomer Component The polycaprolactonediol (Placcel 240, a product of Daicel Chemical Industries, Ltd., molecular weight=4,000) was measured for thermal decomposition temperature in a nitrogen atmosphere by thermogravimetric analysis, and the thermal decomposition temperature was 360° C.

(3) Production of Polybenzoxazole Resin Layer Having Fine Pores

The varnish obtained in the above (2) was coated on a silicon wafer having aluminum vapor-deposited thereon, using a spin coater. At that time, the rpm of the spin coater and the coating time were set so that the film thickness after heat treatment became about 1 µm. After the coating, the coated wafer was dried for 120 seconds on a hot plate of 100° C. The resulting material was placed in an oven in which oxygen concentration was controlled at 100 ppm or less by introduction of nitrogen; and was heated at 150° C. for 30 minutes and at 280° C. for 60 minutes in this order to give rise to dehydration and ring closure to obtain a polybenzoxazole resin film from the material for electrical insulating organic film. The polybenzoxazole resin film was heated at 350° C. for 60 minutes and at 400° C. for 30 minutes for decomposition of the oligomer group, to obtain an electrical insulating organic film. Aluminum was vapor-deposited on the film for patterning, whereby an electrode of given size was formed. A capacity was measured between the electrode and the aluminum on the silicon wafer. After the measurement, the portion of the film in contact with and in the vicinity of the electrode was etched by using oxygen plasma; the film thickness was measured using a surface roughness tester; thereby, the dielectric constant of the film at a frequency of 1 MHz was calculated, which was 2.1. The IR spectrum of the film was measured by FT-IR; as a result, there was no absorption by amide of oxazole at 1,656 cm$^{-1}$, absorption by oxazole was seen at 1,053 cm$^{-1}$ and 1,625 cm$^{-1}$, and formation of polybenzoxazole was confirmed. The heat resistance of the film was evaluated by TG-DTA; as a result, the temperature of 5% weight decrease in nitrogen atmosphere was 513° C.

The cross section of the film was observed by TEM, which indicated that the pores formed had an average pore diameter of 4 nm and were discontinuous.

Example 27

A varnish of a material for electrical insulating organic film was obtained in the same manner as in Example 26 except that in the Example 26 synthesis of polybenzoxazole precursor, 10.73 g (25.0 mmol) of 4,4'-hexafluoroisopropylidenediphenyl-1,1'-dicarboxylic acid chloride was changed to 10.38 g (25.0 mmol) of 2,2'-bis (trifluoromethyl)-4,4'-biphenylenedicarboxylic acid chloride obtained in the same manner as in Synthesis Example 1 and, in the reaction between polybenzoxazole precursor and oligomer and preparation of varnish, of Example 26, 13.6 g (3.4 mmol) of the polycaprolactonediol (molecular weight=4,000) was changed to 6.8 g (3.4 mmol) of a polyethylene oxide monomethyl ether (Uniox M-2000, a product of NOF CORP., molecular weight=2,000). The polybenzoxazole precursor formed before addition of the polyethylene oxide monomethyl ether had a number-average molecular weight of 12,000. Further, the weight fraction of the reacted oligomer component in the material for electrical insulating organic film was 40% by $^1$H-NMR analysis.

Measurement of Thermal Decomposition Temperature of Hydroxyl Group-containing Oligomer Component The polyethylene oxide 'nonomethyl ether (Uniox M-2000, a product of NOF CORP., molecular weight=2, 000) was measured for thermal decomposition temperature in a nitrogen atmosphere by thermogravimetric analysis, and the thermal decomposition temperature was 376° C.

Using the above-obtained varnish, an insulating film was produced and evaluated in the same manner as in Example 26.

As a result, the insulating film had a dielectric constant of 2.2 and a temperature of 5% weight decrease, of 580° C. Further, the cross section of the insulating film was observed by TEM, which indicated that the pores formed had an average pore diameter of 5 nm and were discontinuous.

Example 28

A varnish of a material for electrical insulating organic film was obtained in the same manner as in Example 26 except that in the Example 26 synthesis of polybenzoxazole precursor, 10.73 g (25.0 mmol) of 4,4'-hexafluoroisopropylidenediphenyl-1,1'-dicarboxylic acid chloride was changed to 10.38 g (25.0 mmol) of 2,2'-bis(trifluoromethyl)-4,4'-biphenylenedicarboxylic acid chloride obtained in the same manner as in Synthesis Example 1 and, in the reaction between polybenzoxazole precursor and oligomer and preparation of varnish, of Example 26, 13.6 g (3.4 mmol) of the polycaprolactonediol (molecular weight=4,000) was changed to 11.22 g (3.4 mmol) of a polyethylene oxide-polypropylene oxide-polyethylene oxide triblock copolymer oligomer (a product of NOF CORP., molecular weight=3,300). The polybenzoxazole precursor formed before addition of the polyethylene oxide-polypropylene oxide-polyethylene oxide triblock copolymer oligomer had a number-average molecular weight of 12,000. Further, the weight fraction of the reacted oligomer component in the material for electrical insulating organic film was 39% by $^1$H-NMR analysis.

Measurement of Thermal Decomposition Temperature of Hydroxyl Group-containing Oligomer Component The polyethylene oxide-polypropylene oxide-polyethylene oxide triblock copolymer oligomer was measured for thermal decomposition temperature in a nitrogen atmosphere by thermogravimetric analysis, and the thermal decomposition temperature was 364° C.

Using the above-obtained varnish, an insulating film was produced and evaluated in the same operation as in Example 26.

As a result, the insulating film had a dielectric constant of 2.1 and a temperature of 5% weight decrease, of 580° C. Further, the cross section of the insulating film was observed by TEM, which indicated that the pores formed had an average pore diameter of 4 nm and were discontinuous.

Example 29

A varnish of a material for electrical insulating organic film was obtained in the same manner as in Example 26 except that in the Example 26 synthesis of polybenzoxazole precursor, 10.73 g (25.0 mmol) of 4,4'-hexafluoroisopropylidenediphenyl-1,1'-dicarboxylic acid chloride was changed to 10.38 g (25.0 mmol) of 2,2'-bis(trifluoromethyl)-4,4'-biphenylenedicarboxylic acid chloride obtained in the same manner as in Synthesis Example 1 and, in the reaction between polybenzoxazole precursor and oligomer and preparation of varnish, of Example 26, 13.6 g (3.4 mmol) of the polycaprolactonediol (molecular weight=4,000) was changed to 6.8 g (3.4 mmol) of a polyethylene oxide-polypropylene oxide diblock copolymer oligomer (a product of NOF CORP., molecular weight=2,000). The polybenzoxazole precursor formed before addition of the polyethylene oxide-polypropylene oxide diblock copolymer oligomer had a number-average molecular weight of 12,000. Further, the weight fraction of the reacted oligomer component in the material for electrical insulating organic film was 27% by $^1$H-NMR analysis.

Measurement of Thermal Decomposition Temperature of Hydroxyl Group-containing Oligomer Component The polyethylene oxide-polypropylene oxide diblock copolymer oligomer was measured for thermal decomposition temperature in a nitrogen atmosphere by thermogravimetric analysis, and the thermal decomposition temperature was 360° C.

Using the above-obtained varnish, an insulating film was produced and evaluated in the same operation as in Example 26.

As a result, the insulating film had a dielectric constant of 2.2 and a temperature of 5% weight decrease, of 580° C. Further, the cross section of the insulating film was observed by TEM, which indicated that the pores formed had an average pore diameter of 3 nm and were discontinuous.

Comparative Example 8

A varnish of a material for electrical insulating organic film was obtained in the same manner as in Example 26 except that the amount of 2,2-bis(3-amino-4-hydroxyphenyl)hexafluoropropane used was changed from 8.52 g (23.2 mmol) to 7.33 g (20.0 mmol) and the amount of the polycaprolactonediol (molecular weight=4,000) used was changed from 13.6 g (3.4 mmol) to 40.0 g (10.0 mmol). The polybenzoxazole precursor formed before addition of the polycaprolactonediol had a number-average molecular weight of 4,000. Further, the weight fraction of the reacted oligomer in the material for electrical insulating organic film was 69% by $^1$H-NMR analysis.

Using the above-obtained varnish, an insulating film was produced and evaluated in the same manner as in Example 26.

As a result, the insulating film had a porosity of 66%; however, the measurement of dielectric constant for the polybenzoxazole film was impossible because the upper and lower electrodes caused short-circuiting. The polybenzoxazole film gave a temperature of 5% weight decrease, of 500° C. Further, this polybenzoxazole film had fine pores of 1 μm or more.

Comparative Example 9

A varnish of a material for electrical insulating organic film was obtained in the same manner as in Example 26 except that 13.6 g (3.4 MM) of the polycaprolactonediol (molecular weight=4,000) used in Example 26 was changed to 136 g (3.4 MM) of et polycaprolactone (Placcel H4, a product of Daicel Chemical Industries, Ltd., molecular weight=40,000). The polybenzoxazole precursor formed before addition of the polycaprolactone had a number-average molecular weight of 11,000. Further, the weight fraction of the reacted oligomer in the material for electrical insulating organic: film was 87% by $^1$H-NMR analysis.

Using the above-obtained varnish, an insulating film was produced and evaluated in the same manner as in Example 26.

As a result, the insulating film had a porosity of 85%; however, the measurement of dielectric constant for the polybenzoxazole film was impossible because the upper and lower electrodes caused short-circuiting. The polybenzoxazole film gave a temperature of 5% weight decrease, of 498° C. Further, this polybenzoxazole film had fine pores of several microns.

Comparative Example 10

A varnish of a material for electrical insulating organic film was obtained in the same manner as in Example 26 except that 13.6 g (3.4 mmol) of the polycaprolactonediol (molecular weight=4,000) used in Example 2 was changed to 1.36 g (3.4 mmol) of a polyethylene glycol monomethyl ether (Uniox M 400, a product of NOF CORP., molecular weight=400). The polybenzoxazole precursor formed before addition of the polyethylene glycol monomethyl ether had a number-average molecular weight of 11,000. Further, the weight fraction of the reacted oligomer in the material for electrical insulating organic film was 6% by $^1$H-NMR analysis.

Using the above-obtained varnish, an insulating film was produced and evaluated in the same manner as in Example 26.

As a result, the insulating film had a dielectric constant of 2.6 and a temperature of 5% weight decrease, of 520° C. Further, the cross section of the insulating film was observed, but no pore was seen.

All of the electrical insulating organic films of the present invention obtained in Examples 1 to 29 showed good properties, i.e. low dielectric constant (2.0 to 2.2) and high heat resistance. As appreciated therefrom, the present material for electrical insulating organic film and the electrical insulating organic film obtained therefrom are superior in electrical properties, thermal properties, mechanical properties and physical properties; therefore, they are useful in various applications where electrical properties, thermal properties, mechanical properties and physical properties are required, such as interlayer dielectric and protective film for semiconductor, interlayer dielectric for multilayer circuit, cover coat for flexible copper-clad laminate, solder resist film, liquid crystal-aligning film and the like.

What is claimed is:

1. A process for producing an electrical insulating organic film, which comprises mixing a polybenzoxazole precursor or a polybenzoxazole resin with an oligomer, forming a film from the resulting mixture, and heating the film in nitrogen having an oxygen concentration of 100 ppm or less to give rise to thermal decomposition and gasification of the oligomer, to obtain a polybenzoxazole resin layer having fine pores.

2. A process for producing an electrical insulating organic film according to claim 1, which comprises mixing a polybenzoxazole precursor with an oligomer, forming a film from the resulting mixture, heating the film in nitrogen having an oxygen concentration of 100 ppm or less, giving rise to ring closure of the polybenzoxazole precursor, and heating the resulting material in nitrogen having an oxygen concentration of 100 ppm or less to give rise to thermal decomposition and gasification of the oligomer, to obtain a polybenzoxazole resin layer having fine pores.

3. A process for producing an electrical insulating organic film according to claim 1, which comprises heating a polybenzoxazole precursor in nitrogen having an oxygen concentration of 100 ppm or less, giving rise to ring closure of the polybenzoxazole precursor to form a polybenzoxazole resin, mixing the polybenzoxazole resin with an oligomer, forming a film from the resulting mixture, and heating the film in nitrogen having an oxygen concentration of 100 ppm or less to give rise to thermal decomposition and gasification of the oligomer, to obtain a polybenzoxazole resin layer having fine pores.

4. A process for producing an electrical insulating organic film, which comprises reacting at least one carboxylic acid terminal of a polybenzoxazole precursor with an amino group-containing oligomer to synthesize a material for electrical insulating organic film, forming a film from the material, heating the film in nitrogen having an oxygen concentration of 100 ppm or less to give rise to ring closure of the polybenzoxazole precursor, further heating the resulting material in nitrogen having an oxygen concentration of 100 ppm or less to give rise to thermal decomposition and gasification of the oligomer group, to obtain a polybenzoxazole resin layer having fine pores.

5. A process for producing an electrical insulating organic film, which comprises reacting at least one carboxylic acid terminal of a polybenzoxazole precursor with a hydroxyl group-containing oligomer to synthesize a material for electrical insulating organic film, forming a film from the material, heating the film in nitrogen having an oxygen concentration of 100 ppm or less to give rise to ring closure of the polybenzoxazole precursor, further heating the resulting material in nitrogen having an oxygen concentration of 100 ppm or less to give rise to thermal decomposition and gasification of the oligomer group, to obtain a polybenzoxazole resin layer having fine pores.

6. A process for producing an electrical insulating organic film according to claim 1, wherein the polybenzoxazole precursor has a structure represented by the following formula (2), synthesized from a bisaminophenol compound and a dicarboxylic acid:

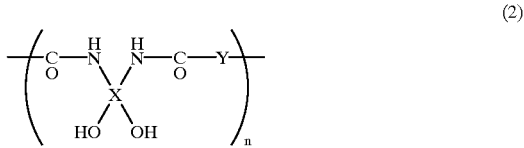

(2)

wherein n is an integer of 2 to 1,000; X is a tetravalent organic group; and Y is a bivalent organic group.

7. A process for producing an electrical insulating organic film according to claim 4, wherein the polybenzoxazole precursor has a structure represented by the following formula (2), synthesized from a bisaminophenol compound and a dicarboxylic acid:

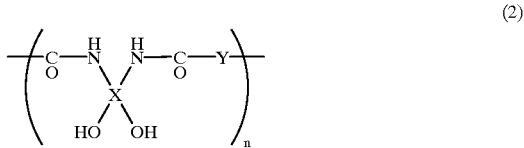

(2)

wherein n is an integer of 2 to 1,000; X is a tetravalent organic group; and Y is a bivalent organic group.

8. A process for producing an electrical insulating organic film according to claim 5, wherein the polybenzoxazole precursor has a structure represented by the following formula (2), synthesized from a bisaminophenol compound and a dicarboxylic acid:

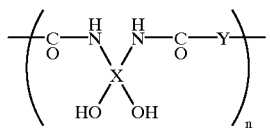

(2)

wherein n is an integer of 2 to 1,000; X is a tetravalent organic group; and Y is a bivalent organic group.

9. A process for producing an electrical insulating organic film according to claim 1, wherein the oligomer has a skeleton of repeating units selected from the group consisting of propylene oxide, ethylene oxide, tetramethylene oxide, methyl methacrylate, urethane, α-methylstyrene, styrene, carbonate, and caprolactone.

10. A process for producing an electrical insulating organic film according to claim 4, wherein the oligomer has a skeleton of repeating units selected from the group consisting of propylene oxide, ethylene oxide, tetramethylene oxide, methyl methacrylate, urethane, α-methylstyrene, styrene, carbonate, and caprolactone.

11. A process for producing an electrical insulating organic film according to claim 5, wherein the oligomer has a skeleton of repeating units selected from the group consisting of propylene oxide, ethylene oxide, tetramethylene oxide, methyl methacrylate, urethane, α-methylstyrene, styrene, carbonate, and caprolactone.

12. A process for producing an electrical insulating organic film according to claim 9, wherein the oligomer has a molecular weight of 500 to 10,000.

13. A process for producing an electrical insulating organic film according to claim 10, wherein the oligomer has a molecular weight of 500 to 10,000.

14. A process for producing an electrical insulating organic film according to claim 11, wherein the oligomer has a molecular weight of 500 to 10,000.

15. A process for producing an electrical insulating organic film according to claim 1, wherein the oligomer is mixed in an amount of 5 to 40% by weight relative to the polybenzoxazole precursor or the polybenzoxazole resin.

16. A process for producing an electrical insulating organic film according to claim 4, wherein the oligomer is reacted with at least one carboxylic acid terminal of the polybenzoxazole precursor in an amount of 5 to 40% by weight relative to the polybenzoxazole precursor.

17. A process for producing an electrical insulating organic film according to claim 5, wherein the oligomer is reacted with at least one carboxylic acid terminal of the polybenzoxazole precursor in an amount of 5 to 40% by weight relative to the polybenzoxazole precursor.

* * * * *